United States Patent
Bergman et al.

(10) Patent No.: US 9,560,746 B1
(45) Date of Patent: Jan. 31, 2017

(54) STRESS RELIEF FOR RIGID COMPONENTS ON FLEXIBLE CIRCUITS

(71) Applicant: Multek Technologies, Ltd., San Jose, CA (US)

(72) Inventors: Mark Bergman, Redwood City, CA (US); Michael James Glickman, Mountain View, CA (US)

(73) Assignee: Multek Technologies, Ltd., San Jose, CA (US)

( * ) Notice: Subject to any disclaimer, the term of this patent is extended or adjusted under 35 U.S.C. 154(b) by 75 days.

(21) Appl. No.: 14/604,476

(22) Filed: Jan. 23, 2015

Related U.S. Application Data

(60) Provisional application No. 61/931,503, filed on Jan. 24, 2014.

(51) Int. Cl.
| | |
|---|---|
| *H05K 1/00* | (2006.01) |
| *H05K 1/02* | (2006.01) |
| *H05K 1/14* | (2006.01) |
| *H05K 1/11* | (2006.01) |
| *H05K 1/03* | (2006.01) |
| *H05K 1/18* | (2006.01) |

(52) U.S. Cl.
CPC ............ *H05K 1/0271* (2013.01); *H05K 1/032* (2013.01); *H05K 1/036* (2013.01); *H05K 1/113* (2013.01); *H05K 1/144* (2013.01); *H05K 1/147* (2013.01); *H05K 1/18* (2013.01); *H05K 2201/0154* (2013.01)

(58) Field of Classification Search
USPC .................................. 361/750, 749; 174/254
See application file for complete search history.

(56) References Cited

U.S. PATENT DOCUMENTS

| | | |
|---|---|---|
| 4,495,546 A | 1/1985 | Nakamura et al. |
| 5,144,742 A | 9/1992 | Lucas |
| 5,204,806 A | 4/1993 | Sasaki et al. |
| 5,262,594 A | 11/1993 | Edwin |
| 5,398,128 A | 3/1995 | Tajima |
| 5,499,444 A | 3/1996 | Doane, Jr. |
| 5,552,776 A | 9/1996 | Wade |
| 5,555,915 A | 9/1996 | Kanao |
| 5,778,941 A | 7/1998 | Inada |
| 5,997,983 A | 12/1999 | Caron |
| 6,031,730 A | 2/2000 | Kroske |
| 6,039,600 A | 3/2000 | Etters et al. |
| 6,103,971 A | 8/2000 | Sato et al. |
| 6,192,940 B1 | 2/2001 | Koma et al. |
| 6,288,343 B1 | 9/2001 | Ahn |
| 6,483,037 B1 | 11/2002 | Moore |
| 6,711,024 B1 | 3/2004 | Johansson |
| 6,882,870 B2 | 4/2005 | Kivela |

(Continued)

*Primary Examiner* — Andargie M Aychillhum
(74) *Attorney, Agent, or Firm* — Haverstock & Owens LLP

(57) ABSTRACT

In order to limit the stress and strain applied to a printed circuit board while still maintaining flexibility, multiple small rigid mesas are formed on a flexible printed circuit, where the rigid mesas are physically isolated by trenches formed around their perimeters. Individual electronic components are attached to the multiple rigid mesas. These trenches form openings at which the printed circuit board is enabled to flex, bend or twist, thereby minimizing, if not eliminating, resulting stress applied to the interconnection between the electronic components and the rigid mesas.

19 Claims, 3 Drawing Sheets

(56) References Cited

U.S. PATENT DOCUMENTS

| | | |
|---|---|---|
| 7,156,127 B2 | 1/2007 | Moulton et al. |
| 7,494,238 B2 | 2/2009 | Kuo |
| 7,735,523 B2 | 6/2010 | Smith et al. |
| 7,998,065 B2 | 8/2011 | Avni |
| 8,188,372 B2 | 5/2012 | Sato |
| 8,525,646 B2 | 9/2013 | Tamm et al. |
| 9,078,115 B2 | 7/2015 | Shumunis |
| 2002/0076948 A1 | 6/2002 | Farrell |
| 2003/0098084 A1 | 5/2003 | Ragner et al. |
| 2003/0111126 A1 | 6/2003 | Moulton et al. |
| 2003/0129905 A1 | 7/2003 | Dhawan et al. |
| 2004/0192082 A1 | 9/2004 | Wagner |
| 2004/0229533 A1 | 11/2004 | Braekevelt et al. |
| 2005/0022338 A1 | 2/2005 | Muhlenkamp |
| 2006/0120059 A1 | 6/2006 | Farkas |
| 2007/0004450 A1 | 1/2007 | Parikh |
| 2007/0089800 A1 | 4/2007 | Sharma |
| 2007/0090894 A1 | 4/2007 | Phan |
| 2007/0190881 A1 | 8/2007 | Shibaoka et al. |
| 2008/0047135 A1 | 2/2008 | Arnold |
| 2008/0258314 A1 | 10/2008 | Yoo |
| 2008/0271220 A1 | 11/2008 | Chilton |
| 2008/0289859 A1 | 11/2008 | Mikado |
| 2009/0160030 A1 | 6/2009 | Tuttle |
| 2009/0242241 A1* | 10/2009 | Takahashi ............ H05K 3/4691 174/254 |
| 2009/0317639 A1 | 12/2009 | Axisa |
| 2010/0012362 A1 | 1/2010 | Abe |
| 2010/0117537 A1 | 5/2010 | Horppu et al. |
| 2010/0199901 A1 | 8/2010 | Kang et al. |
| 2010/0230672 A1 | 9/2010 | Schnitt |
| 2010/0325770 A1 | 12/2010 | Chung |
| 2011/0119812 A1 | 5/2011 | Genz |
| 2011/0120754 A1 | 5/2011 | Kondo |
| 2011/0130060 A1 | 6/2011 | Chung et al. |
| 2011/0175630 A1 | 7/2011 | Bhattacharya |
| 2011/0198118 A1 | 8/2011 | Fang et al. |
| 2012/0286936 A1 | 11/2012 | Mullen et al. |
| 2013/0213695 A1 | 8/2013 | Lee |
| 2013/0299597 A1 | 11/2013 | Sinnett et al. |
| 2014/0047567 A1 | 2/2014 | Haselsteiner et al. |
| 2015/0029652 A1 | 1/2015 | Min |

\* cited by examiner

STRESS RELIEF FOR RIGID COMPONENTS ON FLEXIBLE CIRCUITS

RELATED APPLICATIONS

This Patent Application claims priority under 35 U.S.C. 119(e) of the U.S. provisional patent application, Application No. 61/931,503, filed on Jan. 24, 2014, and entitled "Stress Relief for Rigid Components on Flexible Circuits", which is hereby incorporated in its entirety by reference.

FIELD OF THE INVENTION

The present invention is generally directed to printed circuit boards. More specifically, the present invention is directed to flexible printed circuits having attached rigid components.

BACKGROUND OF THE INVENTION

Electronic devices are increasingly being developed so as to be worn by a user, such as in wearable electronics. As these wearable electronics gain traction in the marketplace, a new breed of devices that are able to bend, flex and stretch must be developed. These mechanical requirements present reliability challenges on mechanical components, circuit boards and other interconnects, as well as electronic components. For dynamic applications, especially where the desired amount of stretch and strain is unknown, it is important to strengthen the printed circuit board so that it is able to bend and twist without failing. Particularly, twisting and bending of a flexible circuit board can create points of failure between rigid and flexible sections. It is desired to develop wearable electronics that limit the stress and strain to the constituent components while still maintaining flexibility and functionality.

SUMMARY OF THE INVENTION

In order to limit the stress and strain applied to a printed circuit board while still maintaining flexibility, multiple small rigid mesas are formed on a flexible printed circuit, where the rigid mesas are physically isolated by trenches formed around their perimeters. Individual electronic components are attached to the multiple rigid mesas. These trenches form openings at which the printed circuit board is enabled to flex, bend or twist, thereby minimizing, if not eliminating, resulting stress applied to the interconnection between the electronic components and the rigid mesas.

In an aspect, a circuit board is disclosed. The circuit board includes a flexible printed circuit comprising a first exterior surface and a second exterior surface opposite the first exterior surface. The circuit board also includes a plurality of rigid sections coupled to the first exterior surface, wherein each rigid section is physically separated from each other rigid section, and each rigid section includes one or more electrical pads. The circuit board also includes a plurality of electronic components, one electrical component coupled to a corresponding one rigid section. In some embodiments, the flexible printed circuit comprises a plurality of stacked layers. In some embodiments, the plurality of stacked layers comprises a plurality of alternating flexible layers and electrically conductive layers. In some embodiments, each flexible layer comprises polyimide or other polymer material. In some embodiments, each electrically conductive layer comprises patterned electrically conductive interconnects. In some embodiments, each rigid section has a higher elastic modulus than each flexible layer. In some embodiments, each rigid section is made of a different material than each flexible layer. In other embodiments, each rigid section is made of the same material as each flexible layer, and each rigid section is thicker than each flexible layer. In some embodiments, the circuit board further comprises a plurality of vias wherein each via is coupled to one of the electrical pads of the rigid section and to an electrically conductive layer in the flexible printed circuit. In some embodiments, each electronic component comprises a plurality of connection pads, one connection pad coupled to a corresponding one electrical pad on the rigid section. In some embodiments, each rigid section consists of one of polyimide or other polymer material, a glass-reinforced polymer, or a printable polymer. In some embodiments, each rigid section has a higher elastic modulus than the flexible printed circuit. In some embodiments, each rigid section is made of a different material than the flexible printed circuit. In some embodiments, the circuit board further comprises one or more additional rigid sections coupled to the second exterior surface of the flexible printed circuit, wherein the one or more additional rigid sections increase an overall rigidity of the circuit board.

In some embodiments, the circuit board further comprises another plurality of rigid sections and another plurality of electronic components. The other plurality of rigid sections is coupled to the second exterior surface, wherein each rigid section of the other plurality is physically separated from each other rigid section of the other plurality, and each rigid section of the other plurality includes one or more electrical pads. One electrical component of the other plurality is coupled to a corresponding one rigid section of the other plurality. In some embodiments, the circuit board further comprises another plurality of vias wherein each via of the other plurality is coupled to one of the electrical pads of the rigid section of the other plurality and to an electrically conductive layer in the flexible printed circuit. In some embodiments, each electronic component of the other plurality comprises a plurality of connection pads, one connection pad coupled to a corresponding one electrical pad on the rigid section of the other plurality.

In another aspect, another circuit board is disclosed. The circuit board includes a flexible printed circuit comprising an exterior surface. The circuit board also includes a plurality of rigid sections coupled to the exterior surface, wherein each rigid section is physically separated from each other rigid section, and each rigid section includes an electrical pad. The circuit board also includes a plurality of electronic components wherein each electronic component comprises a plurality of connection pads, one connection pad is coupled to the electrical pad of a corresponding one rigid section.

In yet another aspect, another circuit board is disclosed. The circuit board includes a flexible printed circuit comprising an exterior surface having a plurality of electrical pads. The circuit board also includes a plurality of rigid sections positioned within the flexible printed circuit, wherein each rigid section is physically separated from each other rigid section. The circuit board also includes a plurality of electronic components wherein each electronic component comprises a plurality of connection pads, wherein one connection pad is coupled to a corresponding electrical pad on the exterior surface of the flexible printed circuit.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
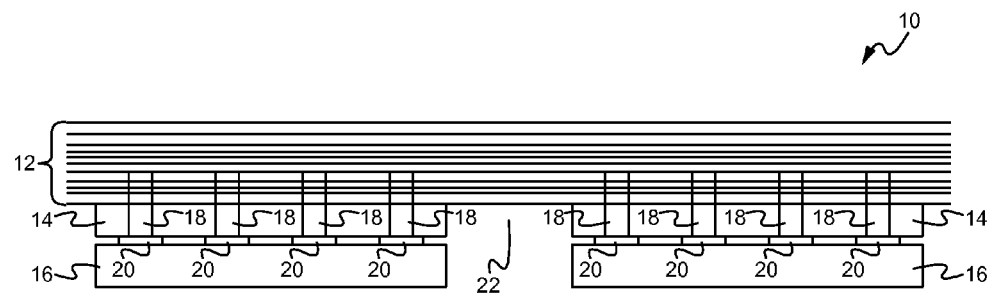
FIG. 1 illustrates a cut out side view of a printed circuit board according to an embodiment.

Embodiments of the present application are directed to a flexible printed circuit having attached rigid components. Those of ordinary skill in the art will realize that the following detailed description of the flexible printed circuits having attached rigid components is illustrative only and is not intended to be in any way limiting. Other embodiments of the flexible printed circuits having attached rigid components will readily suggest themselves to such skilled persons having the benefit of this disclosure.

Reference will now be made in detail to implementations of the flexible printed circuits having attached rigid components as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

A printed circuit board can be configured having a plurality of rigid sections, referred to as rigid mesas, attached to a flexible printed circuit (FPC). The FPC includes a plurality of stacked layers, the layers made of flexible layers and conductive layers. In some embodiments, each flexible layer is made of polyimide. It is understood that other flexible materials can be used. In some embodiments, each conductive layer includes patterned copper interconnects that form electrically conductive interconnects, such as conductive traces. It is understood that other electrically conductive materials can be used. In some embodiments, the stacked layers are arranged as alternating flexible layers and conductive layers. As used herein, "rigid" is a relative term and refers to those sections that are more rigid than other sections such as the flexible layers. Electronic components are electrically and mechanically coupled to the rigid mesas. In some embodiments, one electronic component is coupled to a corresponding one rigid mesa. Each electronic component includes a plurality of connection pads, one connection pad is coupled with a corresponding one electrical pad on the mesa. In other embodiments, each rigid mesa includes a single electrical pad, and each electronic component is coupled to multiple rigid mesas such that each connection pad on the electronic component is coupled to a corresponding one rigid mesa.

FIG. 1 illustrates a cut out side view of a printed circuit board according to an embodiment. The printed circuit board 10 includes a FPC 12, rigid mesas 14 and electronic components 16. The FPC 12 includes a plurality of stacked layers, the layers made of flexible layers and conductive layers. In some embodiments, each flexible layer is made of polyimide. It is understood that other flexible materials can be used. In some embodiments, each conductive layer includes patterned copper interconnects that form electrically conductive interconnects, such as conductive traces. It is understood that other electrically conductive materials can be used. In some embodiments, the stacked layers are arranged as alternating flexible layers and conductive layers. The rigid mesas 14 are formed on a first exterior surface of the FPC 12. In the exemplary configuration shown in FIG. 1, the first exterior surface is the bottom surface of the FPC stack. Each rigid mesa 14 is physically separated from an adjacent rigid mesa 14 by an opening 22. In some embodiments, the rigid mesas 14 are formed by laminating a rigid sheet to the first exterior surface of the FPC 12. The rigid mesas 14 are formed by laser cutting or stamping out the rigid sheet to remove portions of the rigid sheet, such as cutting a trench in the rigid sheet around where each electronic component is mounted, thereby forming the openings where the portions of the rigid sheet are removed. The opening 22 forms a point of flexion where the printed circuit board 10 can bend or twist with reduced stress to the connection formed between the rigid mesa 14 and the electronic component 16.

A plurality of vias 18 are formed through each rigid mesa 14. In the exemplary configuration shown in FIG. 1, there are four vias 18 for each rigid mesa 14. It is understood that more or less than four vias can be formed through each rigid mesa. Each via 18 is coupled to a conductive layer within the FPC 12. Although each of the vias 18 is shown in FIG. 1 as being coupled to the same conductive layer, it is understood that each via can extend to any one of the conductive layers or electrical interconnects formed in the FPC 12. An electrical pad 20 is coupled to each of the vias 18, providing an electrical interconnect point. An electronic component 16 is coupled to each mesa 14. Each electronic component 16 includes a plurality of connection pads (not shown), each one of which is coupled to a corresponding one electrical pad 20 for providing an electrical interconnection. The electrical pad can be mechanically and electrically connected to the connection pad using any conventional means, including but not limited to solder or electrically conductive adhesive. Examples of electronic components include, but are not limited to, LEDs, integrated circuits (ICs), capacitors, resistors and inductors. It is understood that the electronic components 16 can be of the same or different types. Some electronic components may have as few as two connection pads, such as a resistor. Other electronic components, such as an IC, may have a few hundred connection pads.

Each rigid mesa 14 is shown in FIG. 1 to have the same size footprint as the attached electronic component 16. It is understood that the footprint of the rigid mesa can be larger or smaller than the attached electronic component. Both rigid mesas 14 and electronic components 16 are shown in FIG. 1 as having the same size and shape. It is understood that each rigid mesa may have a different shape. It is also understood the each rigid mesa may be differently shaped than its corresponding attached electronic component.

Each rigid mesa has a higher elastic modulus than the FPC. In some embodiments, each rigid mesa is made from polyimide, or other polymer material, a glass-reinforced polymer such as FR4, or a printable polymer. In some embodiments, the flexible layers of the FPC are made from polyimide or other polymer material. The flexible layers and the rigid mesa can be made of different types of polyimide, where the polyimide used for the rigid mesa has a higher elastic modulus than the polyimide used for the flexible layers. The rigid mesas can alternatively or also be made more rigid than the flexible layers by increasing the thickness layer of the rigid mesa relative to a thickness of the flexible layers of the FPC. It is well known that rigidity increases with increasing thickness. In the case where rigidity equals the cube of the thickness, doubling the thickness of the rigid mesa compared to a thickness of the flexible layer in the FPC, even where the same material is used for both, increases the rigidity of the rigid mesa by eight-fold. As such, the rigidity of certain areas can be adjusted without having to change the material, simply adjust the thickness. Preferably though the rigid mesa is made from a more rigid type of polyimide, such as FR4, than that of the flexible layers in the FPC. In some embodiments, the flexible layers of the FPC are made of a polyimide film with no glass reinforcement.

The overall flexibility/rigidity of the printed circuit board can be adjusted by selective use of materials and thicknesses for the rigid mesa and the FPC. The overall flexibility/rigidity can also be adjusted by adding one or more rigid mesas on the opposite exterior surface of the FPC 12. These rigid mesas may or may not have the same dimensions and/or relative placement on the FPC as compared to the rigid mesas 14. Electronic components are not attached to theses rigid mesas, as these rigid mesas function strictly for adjusting the overall flexibility/rigidity of the printed circuit board.

Forming a plurality of mesas enables mounting of rigid electronic components on flexible substrates while minimizing if not eliminating stress applied to the electronic components that can crack either the solder joints, adhesive or the electronic component itself. In an exemplary application, it is possible to manufacture a flexible display made of LEDs mounted to an array of rigid mesas formed on a flexible substrate.

Figure 2:
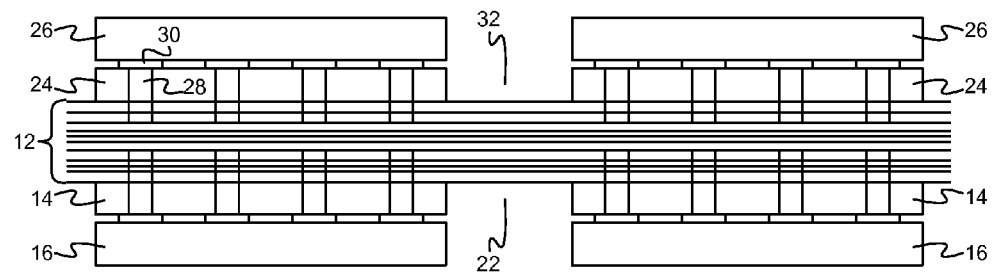
FIG. 2 illustrates a cut out side view of a printed circuit board according to another embodiment.

FIG. 1 shows rigid mesas and attached electronic components formed on a single side of the FPC. In some embodiments, rigid mesas and attached electronic components can be formed on both opposing sides of the FPC. FIG. 2 illustrates a cut out side view of a printed circuit board according to another embodiment. The printed circuit board shown in FIG. 2 is the printed circuit board 10 from FIG. 1 with additional rigid mesas 24 formed on the second exterior surface of the FPC 12. Each rigid mesa 24 is physically separated from an adjacent rigid mesa 24 by an opening 32. A plurality of vias 28 are formed through each rigid mesa 24. In the exemplary configuration shown in FIG. 2, there are four vias 28 for each rigid mesa 24. It is understood that more or less than four vias can be formed through each rigid mesa. Each via 28 is coupled to a conductive layer within the FPC 12. Although each of the vias 28 is shown in FIG. 2 as being coupled to the same conductive layer, it is understood that each via can extend to any one of the conductive layers or electrical interconnects formed in the FPC 12. An electrical pad 30 is coupled to each of the vias 28, providing an electrical interconnect point. An electronic component 26 is coupled to each mesa 14. Each electronic component 26 includes a plurality of connection pads (not shown), each one of which is coupled to a corresponding one electrical pad 30 for providing an electrical interconnection. It is understood that the electronic components 26 can be of the same or different types.

The rigid mesas 24 and attached electronic components 26 are shown as being symmetrically dimensioned and aligned as the rigid mesas 14 and attached electronic components 16. It is understood that the shape, dimension, and position of each rigid mesa and attached electronic component, as well as the number of rigid mesas and attached electronic components on one exterior surface of the FPC may be different than those on the other exterior surface.

Figure 3:
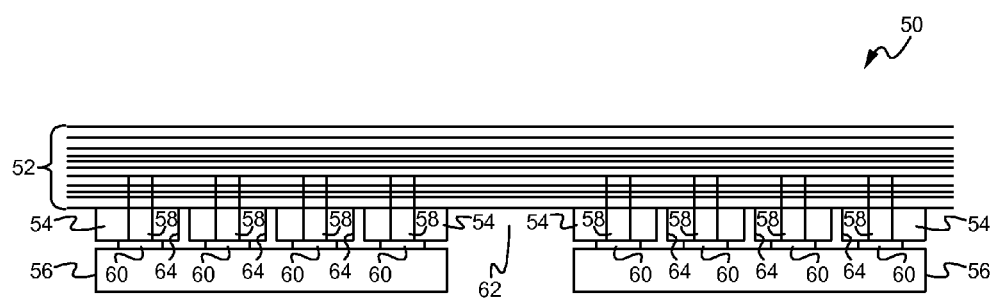
FIG. 3 illustrates a cut out side view of a printed circuit board according to another embodiment.

In the embodiments shown in FIGS. 1 and 2, there is one rigid mesa per electronic component, and each rigid mesa includes a plurality of electrical pads. In other embodiments, one rigid mesa is formed for each electrical pad. In this configuration, there are multiple rigid mesas coupled to a single electronic component, as each electronic component has at least two connection pads. FIG. 3 illustrates a cut out side view of a printed circuit board according to another embodiment. The printed circuit board 50 shown in FIG. 3 is similar to the printed circuit board 10 of FIG. 1 except that the printed circuit board 50 is configured to have one rigid mesa per electrical pad. The printed circuit board 50 includes an FPC 52, rigid mesas 54 and electronic components 56. In the exemplary configuration shown in FIG. 3, each electronic component 64 has four connection pads, and therefore there are four rigid mesas 54, each having an electrical pad 60 and via 58, coupled to each electronic component. The rigid mesas 54 attached to a common electronic component 56 are each physically separated from an adjacent rigid mesa 54 by an opening 64. Rigid mesas 54 attached to different electronic components 56 are each physically separated by an opening 62. Typically, the spacing between adjacent connection pads on a common electronic device is smaller than the spacing between adjacent electronic components, and as such the openings 64 are typically smaller than the openings 62, although this is not necessarily the case.

Each via 58 is coupled to a conductive layer within the FPC 52. The FPC 52 can be similarly configured as the FPC 12 in FIG. 1. Although each of the vias 58 is shown in FIG. 3 as being coupled to the same conductive layer in the FPC 52, it is understood that each via can extend to any one of the conductive layers or electrical interconnects formed in the FPC 52.

Figure 4:
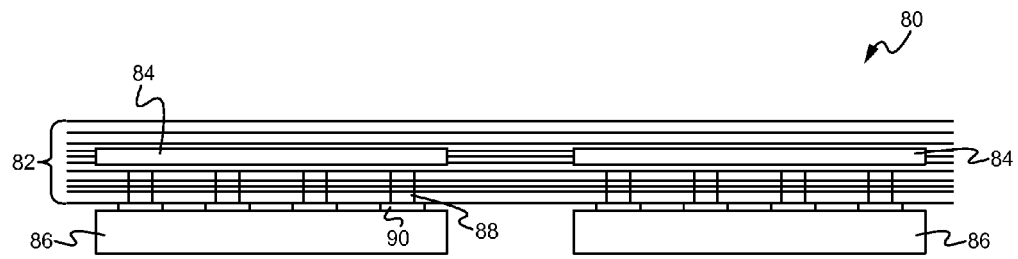
FIG. 4 illustrates a cut out side view of a printed circuit board according to another embodiment.

In the embodiments shown in FIGS. 1-3, the rigid mesas are formed on an exterior surface of the FPC. In other embodiments, the rigid mesas can be formed within the interior of the FPC, and the electronic components are coupled to electrical pads on an exterior surface of the FPC. FIG. 4 illustrates a cut out side view of a printed circuit board according to another embodiment. The printed circuit board 80 includes an FPC 82, rigid mesas 84 and electronic components 86. The FPC 82 is similar to the FPC 12 in FIG. 1 in that the FPC 82 includes a plurality of stacked layers, the layers made of flexible layers and conductive layers. However, in the embodiment of FIG. 4, the rigid mesas 84 are formed within the interior of the FPC 82. To effectively mount an electronic component, a rigid support is provided onto which the electronic component is mounted. In the embodiments of FIGS. 1-3, an electronic component is mounted directly onto such a rigid support. In the embodiment of FIG. 4, an electronic component is mounted indirectly onto such a rigid support, with intervening FPC material between the two. Each rigid mesa 84 is physically separated from an adjacent rigid mesa 84. In some embodiments, the rigid mesas 14 are pre-formed and added to removed sections within the FPC. In other embodiments, the rigid mesas 84 are added as part of the FPC fabrication process.

A plurality of vias 88 are formed through a portion of the FPC 82. Each via 18 is coupled to a conductive layer within the FPC 12. Although each of the vias 88 is shown in FIG. 4 as being coupled to the same conductive layer in the FPC 82, it is understood that each via can extend to any one of the conductive layers or electrical interconnects formed in the FPC 82. An electrical pad 90 is coupled to each of the vias 88, providing an electrical interconnect point. An electronic component 86 is coupled to the FPC 82 via the electrical pads 90. Each electronic component 86 includes a plurality of connection pads (not shown), each one of which is coupled to a corresponding one electrical pad 90 for providing an electrical interconnection. The electrical pad can be mechanically and electrically connected to the connection pad using any conventional means, including but not limited to solder or electrically conductive adhesive. It is understood that the electronic components 86 can be of the same or different types. In the exemplary configuration shown in FIG. 4, there are four vias 88 for each electronic component 86. It is understood that more or less than four vias can be formed for each electronic component.

FIG. 4 shows one rigid mesa 84 corresponding to each electronic component 86. Alternatively, more than one rigid mesa can correspond to each electronic component. For example, the rigid mesa 84 can be sub-divided into smaller rigid mesas, similar to the rigid mesas 54 in FIG. 3.

Each rigid mesa 84 is shown in FIG. 4 to have the same size footprint as the corresponding electronic component 86. It is understood that the footprint of the rigid mesa can be larger or smaller than the corresponding electronic component. Both rigid mesas 84 and electronic components 86 are shown in FIG. 4 as having the same size and shape. It is understood that each rigid mesa may have a different shape. It is also understood the each rigid mesa may be differently shaped than its corresponding electronic component.

Figure 5:
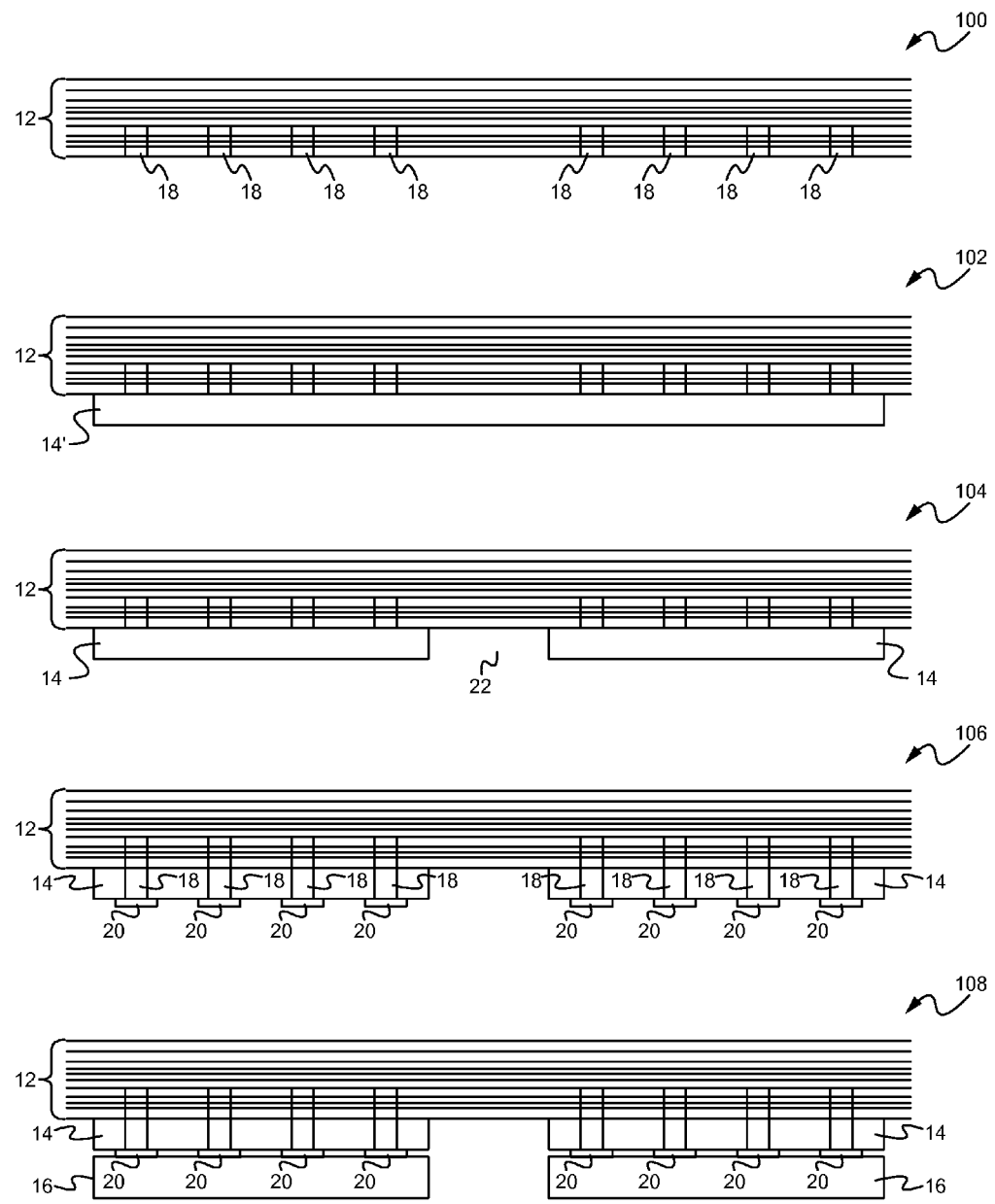
FIG. 5 illustrates a process for fabricating a printed circuit board according to an embodiment.

FIG. 5 illustrates a process for fabricating a printed circuit board according to an embodiment. The process described in relation to FIG. 5 corresponds to the printed circuit board 10 in FIG. 1. It is understood that the concepts described in relation to the process of FIG. 5 can alternatively be used to fabricate the alternative embodiments shown in FIGS. 2-4, as well as alternative embodiments not explicitly described in FIGS. 1-5 but nevertheless enabled by the concepts described in relation to FIGS. 1-5.

At the step 100, the FPC 12 is provided and vias 18 are formed. Any conventional method for forming the vias within the FPC can be used. In some embodiments, the vias are made of copper or copper plating. It is understood that alternative conductive materials can be used. Each via 18 is formed to provided an application specific interconnect to a conductive interconnect included within the FPC.

At the step 102, a rigid sheet 14' is coupled to the first exterior surface of the FPC 12. In some embodiments, the rigid sheet 14' is laminated to the FPC 12. At the step 104, selective portions of the rigid sheet 14' are removed to form rigid mesas 14. The removed portions form openings 22 between adjacent rigid mesas 14. Although the opening 22 is shown as a channel in the two-dimensional representation of FIGS. 1 and 5, the removed portion forms a trench around the entire perimeter of the rigid mesa. In some embodiments, a laser or other cutting device is used to remove portions of the rigid sheet.

At the step 106, vias 18 are formed through each rigid mesa 14 to match up with the portion of the via 18 already formed in the FPC 12. In alternative embodiments, the vias 18 are not formed in the FPC 12 at the step 102, but instead the vias 18 are formed through both the rigid mesas 14 and the FPC 12 at the step 106. After the vias 18 are formed, electrical pads 20 are formed at the exposed surface of the rigid mesas 14 and each electrical pad is connected to a corresponding via 18.

At the step 108, electronic components 16 are attached to the rigid mesas 14. In some embodiments, a solder joint is formed between each connection pad on the electronic component 16 and the corresponding electrical pad 20 on the rigid mesa 14. In other embodiments, an electrically conductive adhesive is used.

The present application has been described in terms of specific embodiments incorporating details to facilitate the understanding of the principles of construction and operation of the flexible printed circuits having attached rigid components. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A circuit board comprising:
  a. a flexible printed circuit comprising a first exterior surface and a second exterior surface opposite the first exterior surface;
  b. a plurality of rigid sections coupled to the first exterior surface, wherein each rigid section is physically separated from each other rigid section, and each rigid section includes one or more electrical pads, further wherein each rigid section comprises a first rigid section surface and a second rigid section surface opposite the first rigid section surface, wherein an entire footprint of each first rigid section surface is coupled to the first exterior surface of the flexible printed circuit; and
  c. a plurality of electronic components, one electrical component coupled to a corresponding one rigid section at the second rigid section surface such that the one electrical component, the one rigid section and the flexible printed circuit form a stack.

2. The circuit board of claim 1 wherein the flexible printed circuit comprises a plurality of stacked layers.

3. The circuit board of claim 2 wherein the plurality of stacked layers comprises a plurality of alternating flexible layers and electrically conductive layers.

4. The circuit board of claim 3 wherein each flexible layer comprises polyimide or other polymer material.

5. The circuit board of claim 3 wherein each electrically conductive layer comprises patterned electrically conductive interconnects.

6. The circuit board of claim 3 wherein each rigid section has a higher elastic modulus than each flexible layer.

7. The circuit board of claim 6 wherein each rigid section is made of a different material than each flexible layer.

8. The circuit board of claim 6 wherein each rigid section is made of the same material as each flexible layer, and each rigid section is thicker than each flexible layer.

9. The circuit board of claim 1 further comprising a plurality of vias wherein each via is coupled to one of the electrical pads of the rigid section and to an electrically conductive layer in the flexible printed circuit.

10. The circuit board of claim 9 wherein each electronic component comprises a plurality of connection pads, one connection pad coupled to a corresponding one electrical pad on the rigid section.

11. The circuit board of claim 1 wherein each rigid section consists of one of polyimide or other polymer material, a glass-reinforced polymer, or a printable polymer.

12. The circuit board of claim 1 wherein each rigid section has a higher elastic modulus than the flexible printed circuit.

13. The circuit board of claim 1 wherein each rigid section is made of a different material than the flexible printed circuit.

14. The circuit board of claim 1 further comprising one or more additional rigid sections coupled to the second exterior surface of the flexible printed circuit, wherein the one or more additional rigid sections increase an overall rigidity of the circuit board.

15. The circuit board of claim 1 further comprising:
 a. another plurality of rigid sections coupled to the second exterior surface, wherein each rigid section of the other plurality is physically separated from each other rigid section of the other plurality, and each rigid section of the other plurality includes one or more electrical pads; and
 c. another plurality of electronic components, one electrical component of the other plurality coupled to a corresponding one rigid section of the other plurality.

16. The circuit board of claim 15 further comprising another plurality of vias wherein each via of the other plurality is coupled to one of the electrical pads of the rigid section of the other plurality and to an electrically conductive layer in the flexible printed circuit.

17. The circuit board of claim 16 wherein each electronic component of the other plurality comprises a plurality of connection pads, one connection pad coupled to a corresponding one electrical pad on the rigid section of the other plurality.

18. A circuit board comprising:
 a. a flexible printed circuit comprising an exterior surface;
 b. a plurality of rigid sections coupled to the exterior surface, wherein each rigid section is physically separated from each other rigid section, and each rigid section includes an electrical pad; and
 c. a plurality of electronic components wherein each electronic component comprises a plurality of connection pads, one connection pad is coupled to the electrical pad of a corresponding one rigid section.

19. A circuit board comprising:
 a. a flexible printed circuit comprising an exterior surface having a plurality of electrical pads;
 b. a plurality of rigid sections positioned within the flexible printed circuit, wherein each rigid section is physically separated from each other rigid section; and
 c. a plurality of electronic components wherein each electronic component comprises a plurality of connection pads, wherein one connection pad is coupled to a corresponding electrical pad on the exterior surface of the flexible printed circuit.

* * * * *